US008899469B2

United States Patent
Gillotti et al.

(10) Patent No.: US 8,899,469 B2
(45) Date of Patent: Dec. 2, 2014

(54) AUTOMATIC REWORK PROCESSES FOR NON-STICK CONDITIONS IN WIRE BONDING OPERATIONS

(71) Applicant: Kulicke and Soffa Industries, Inc., Fort Washington, PA (US)

(72) Inventors: Gary S. Gillotti, North Wales, PA (US); John Foley, Quakertown, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 14/183,709

(22) Filed: Feb. 19, 2014

(65) Prior Publication Data

US 2014/0246480 A1  Sep. 4, 2014

Related U.S. Application Data

(60) Provisional application No. 61/772,456, filed on Mar. 4, 2013.

(51) Int. Cl.
*B23K 31/02*   (2006.01)
*H01L 23/00*   (2006.01)
*H01L 21/66*   (2006.01)

(52) U.S. Cl.
CPC .............. *H01L 22/14* (2013.01); *H01L 24/85* (2013.01)
USPC .......... 228/102; 228/103; 228/104; 228/180.5

(58) Field of Classification Search
None
See application file for complete search history.

(56) References Cited

U.S. PATENT DOCUMENTS

| 4,272,007 | A  | * | 6/1981  | Steranko          | 228/213 |
|-----------|----|---|---------|-------------------|---------|
| 4,555,052 | A  | * | 11/1985 | Kurtz et al.      | 228/104 |
| 5,566,876 | A  | * | 10/1996 | Nishimaki et al.  | 228/102 |
| 6,363,293 | B1 | * | 3/2002  | Kinnaird          | 700/121 |
| 6,449,516 | B1 | * | 9/2002  | Kyomasu et al.    | 700/58  |
| 6,468,813 | B1 | * | 10/2002 | Chao et al.       | 438/7   |
| 7,004,373 | B1 | * | 2/2006  | Miller            | 228/103 |
| 7,686,204 | B2 | * | 3/2010  | Takahashi et al.  | 228/103 |
| 8,152,046 | B2 |   | 4/2012  | Gillotti          |         |
| 2002/0117330 | A1 | * | 8/2002 | Eldridge et al.  | 174/260 |
| 2003/0019909 | A1 | * | 1/2003 | Beatson et al.   | 228/102 |
| 2003/0085255 | A1 | * | 5/2003 | Farassat         | 228/103 |
| 2003/0124834 | A1 | * | 7/2003 | Tseng et al.     | 438/617 |
| 2003/0218050 | A1 | * | 11/2003 | Kanemoto et al. | 228/103 |
| 2006/0186177 | A1 | * | 8/2006 | Mii et al.       | 228/101 |
| 2007/0187138 | A1 | * | 8/2007 | Takahashi et al. | 174/257 |
| 2010/0155455 | A1 | * | 6/2010 | Mii et al.       | 228/102 |
| 2011/0146408 | A1 | * | 6/2011 | Aoyagi et al.    | 73/588  |
| 2012/0005976 | A1 | * | 1/2012 | Leonard          | 52/292  |
| 2012/0055976 | A1 | * | 3/2012 | Akiyama et al.   | 228/104 |
| 2014/0103096 | A1 | * | 4/2014 | Zhang et al.     | 228/104 |

FOREIGN PATENT DOCUMENTS

KR         100837201  B1  *  6/2008

* cited by examiner

*Primary Examiner* — Kiley Stoner
(74) *Attorney, Agent, or Firm* — Stradley Ronon Stevens & Young, LLP

(57) ABSTRACT

A method of performing a wire bonding operation is provided. The method includes the steps of: (a) performing a wire bonding operation between a portion of wire and a bonding location using a bonding tool; (b) raising the bonding tool to a desired height; (c) performing a test to determine if the portion of wire is sufficiently bonded to the bonding location; and (d) automatically performing another wire bonding operation between the portion of wire and the bonding location using the bonding tool if, during step (c), it is determined that the portion of wire was not sufficiently bonded to the bonding location in step (a).

20 Claims, 12 Drawing Sheets

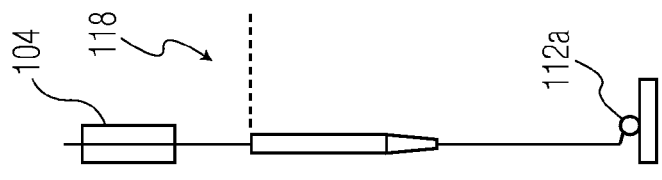
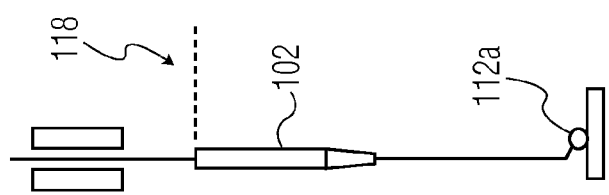
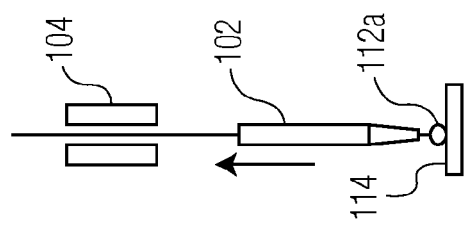
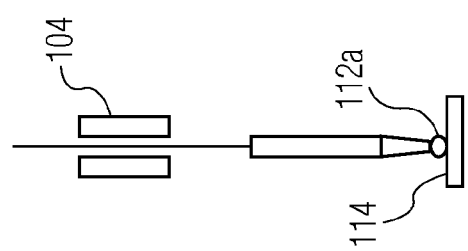
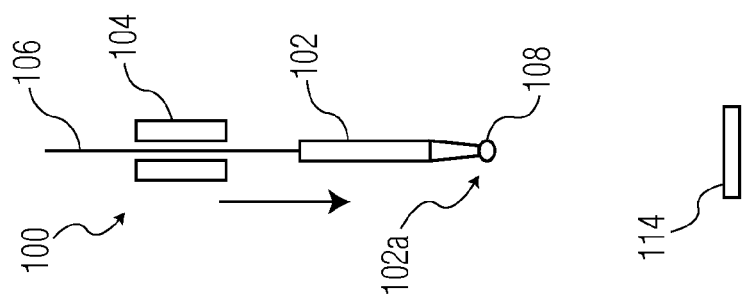

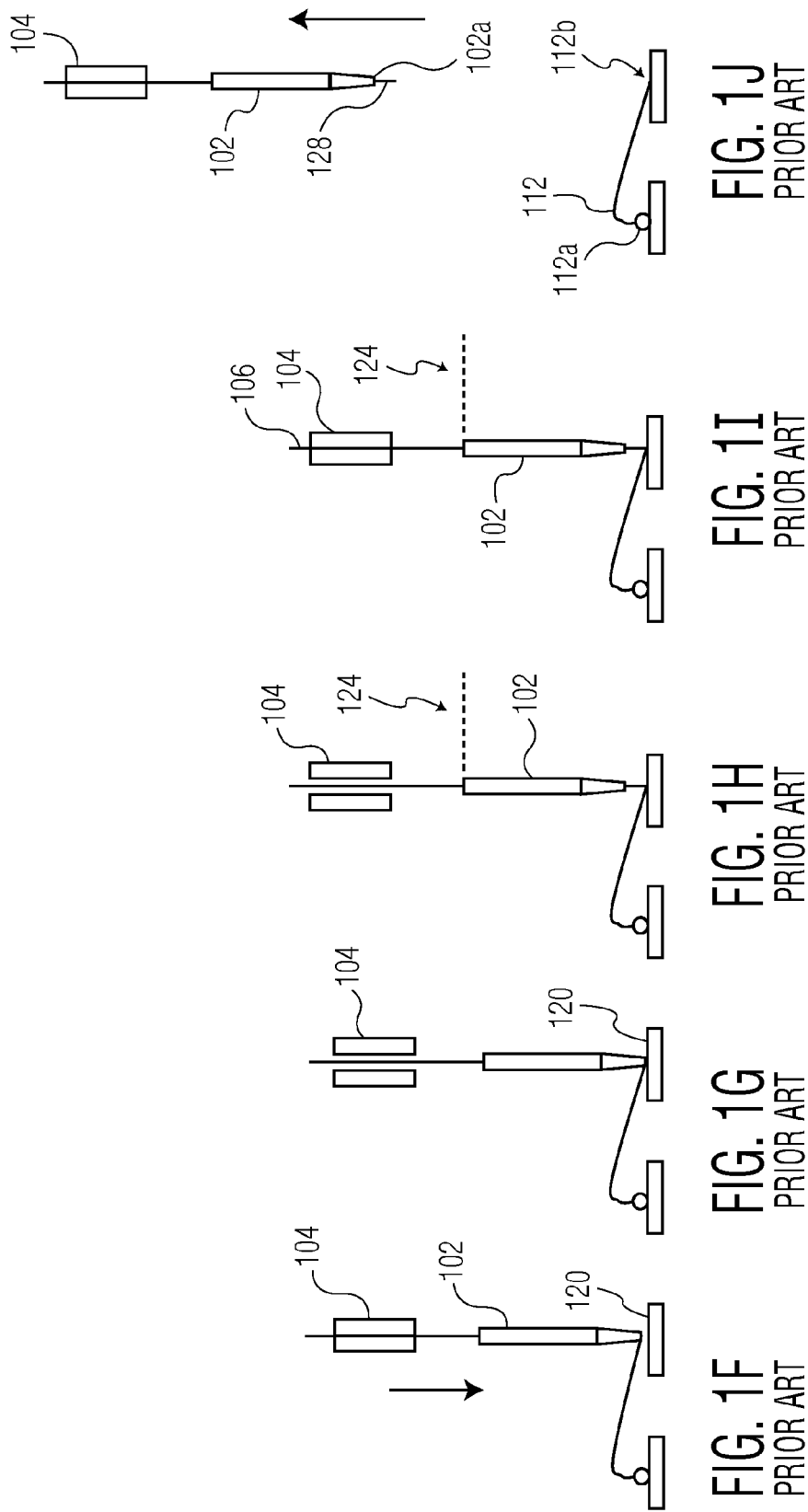

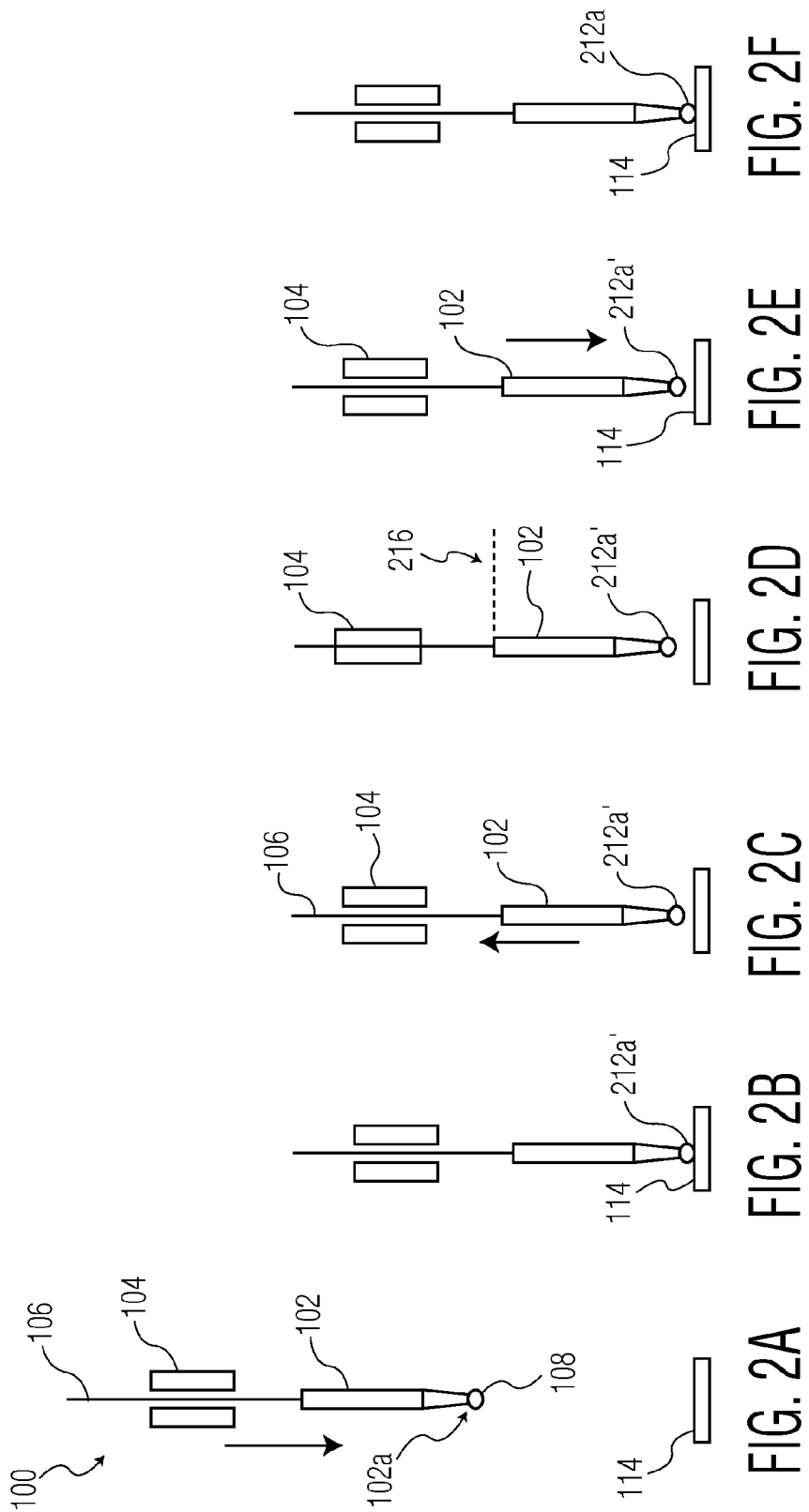

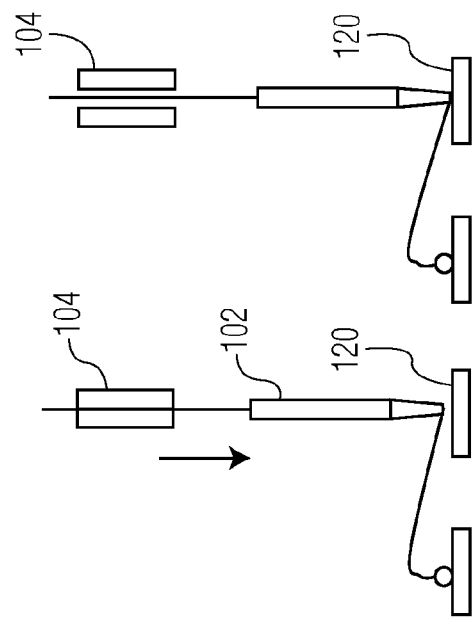
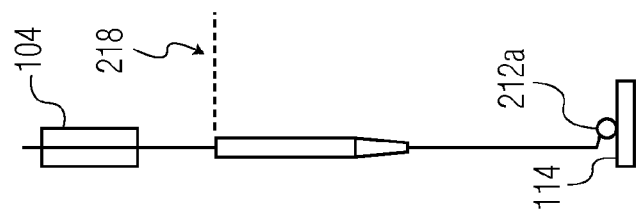
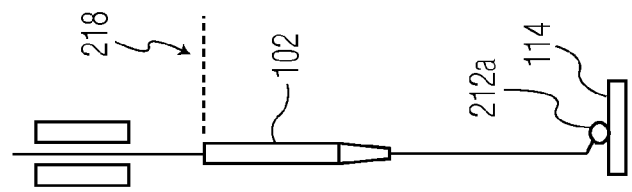
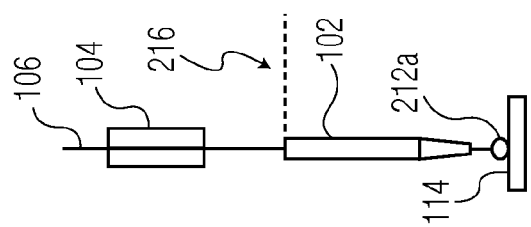
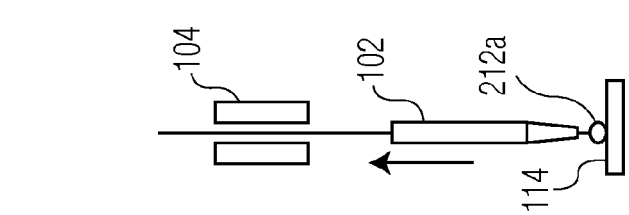

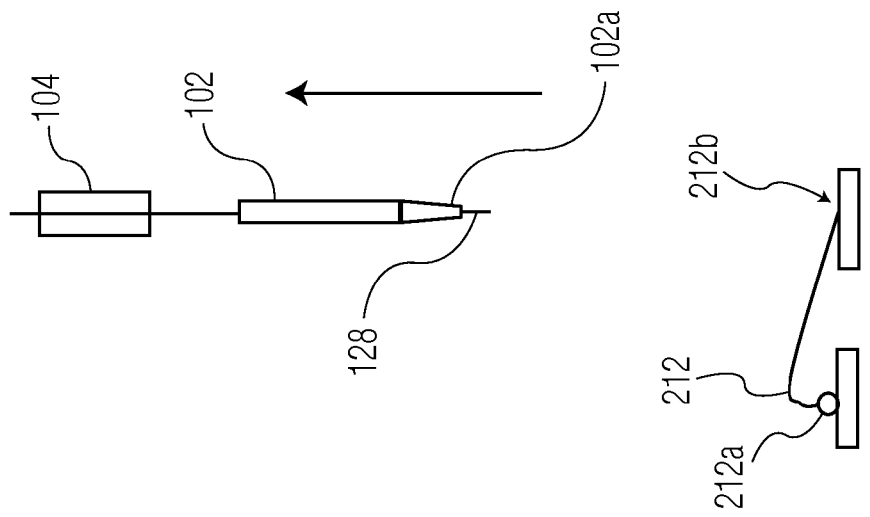
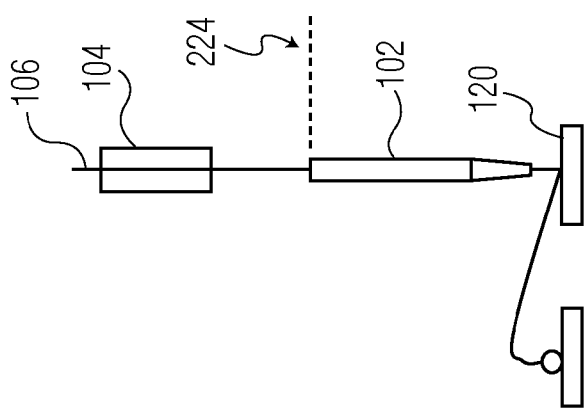
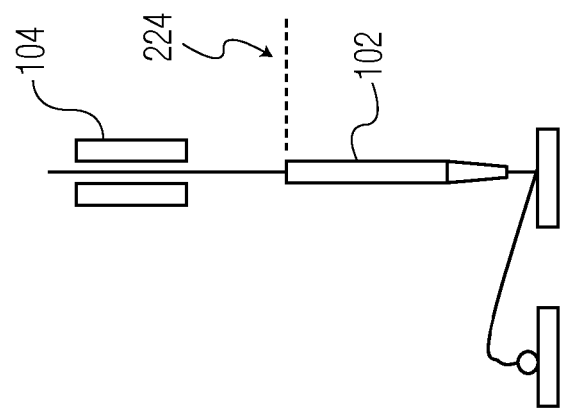

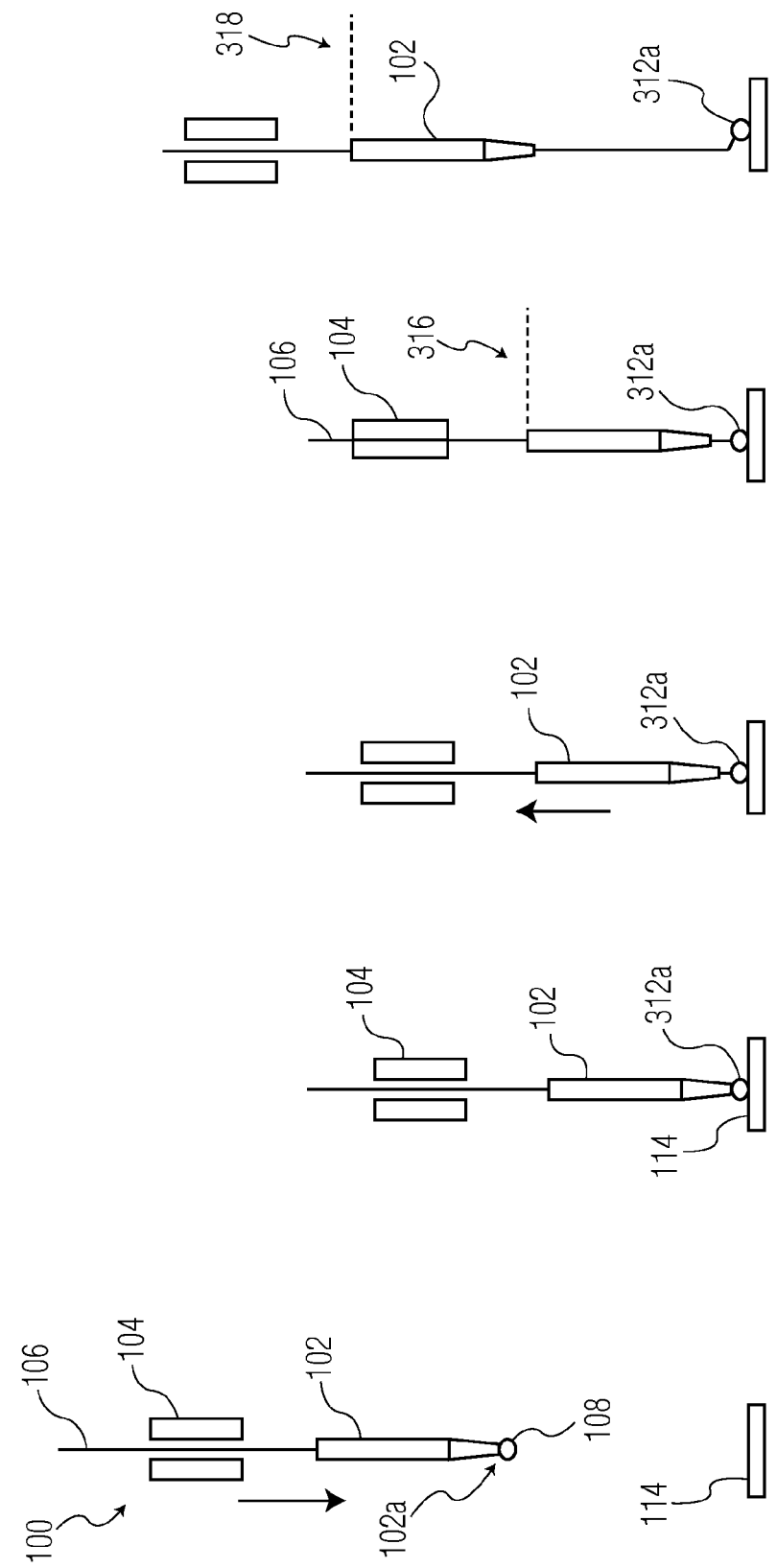

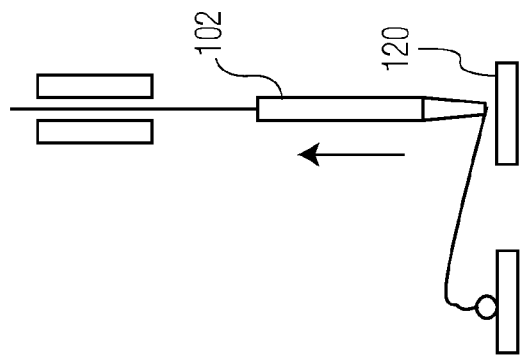
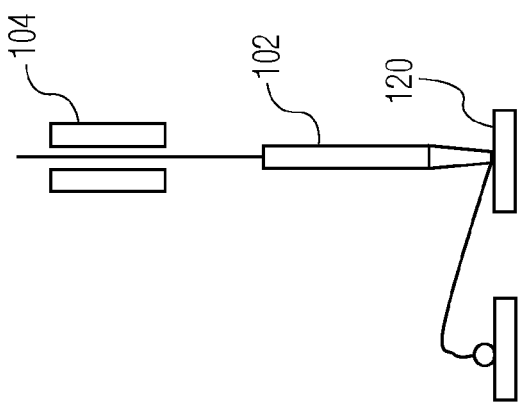
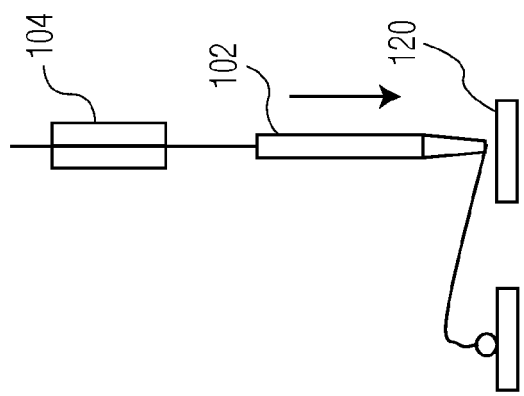
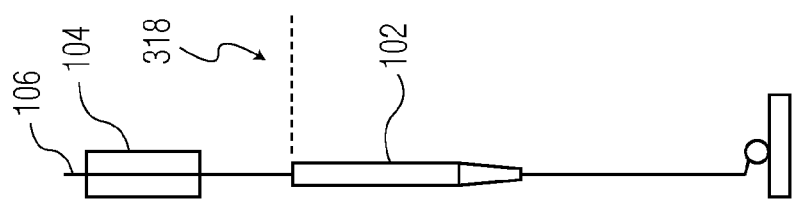

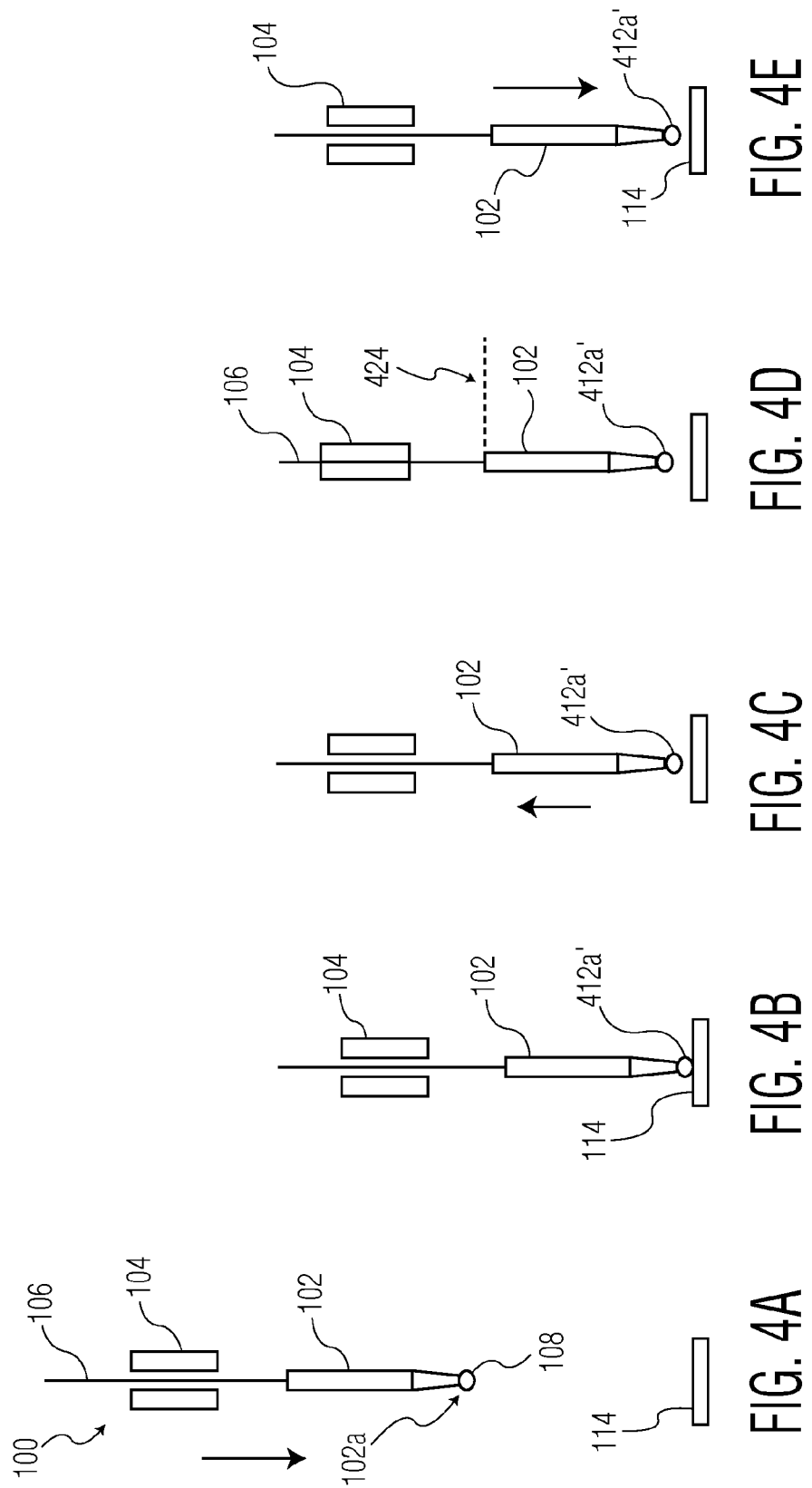

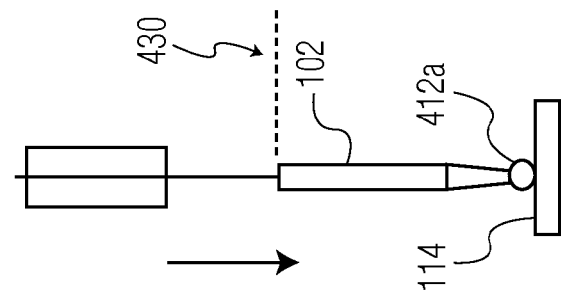
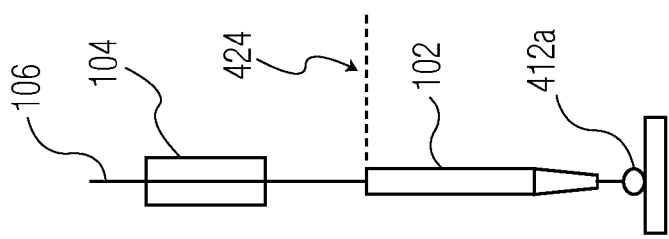
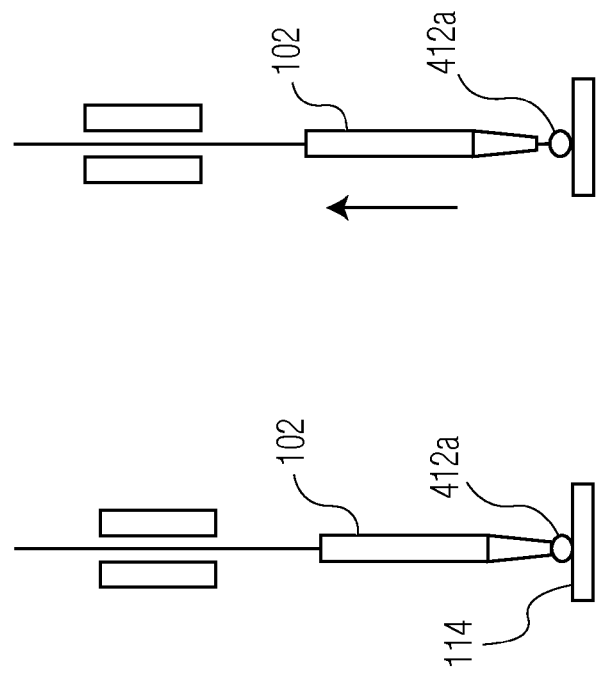

AUTOMATIC REWORK PROCESSES FOR NON-STICK CONDITIONS IN WIRE BONDING OPERATIONS

CROSS REFERENCE

This application claims the benefit of U.S. Provisional Patent Application No. 61/772,456 filed Mar. 4, 2013, the content of which is incorporated herein by reference.

FIELD OF THE INVENTION

The present invention relates to wire bonding operations (e.g., the formation of wire loops, the formation of conductive bumps, etc.), and to improved wire bonding operations.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., stud bumping machines) are also used to form conductive bumps from portions of wire.

During ball bonding operations, a tail of wire extending from the tip of a bonding tool (e.g., a capillary) is melted into a free air ball using a spark from an electronic flame-off (EFO) device. The free air ball is then used to form a first bond (e.g., a ball bond) at a first bonding location, and the wire is extended from the ball bond to a second bonding location, where a second bond (e.g., a stitch bond) is formed by bonding a portion of the wire to the second bonding location using the bonding tool. For example, the first bonding location may be a bonding pad of a semiconductor chip, and the second bonding location may be a lead of a leadframe adjacent a semiconductor chip. The bonding tool may then be raised to a short tail detect height where the wire is tested (e.g., using an electrical continuity test) to ensure it is still continuous with the stitch bond on the second bonding location. If no short tail is detected, the bond head (i.e., carrying the bonding tool and a wire clamp, now closed) is raised to tear the wire at the stitch bond. The remaining tail length may then be used to form another free air ball for another wire loop.

Specifically referring now to FIGS. 1A-1J, a conventional method of forming a wire loop is illustrated. FIG. 1A illustrates parts of a wire bonding machine 100 including bonding tool 102 (e.g., capillary 102), wire clamps 104 (in an open position in FIG. 1A), wire 106, and free air ball 108 having been formed and seated at tip 102a of bonding tool 102. In FIG. 1A, bonding tool 102 is shown moving towards first bonding location 114 (e.g., bond pad 114 of a semiconductor die) as indicated by the downward arrow. Wire 106 is continuous with free air ball 108 and extends through bonding tool 102 and back to a wire supply (e.g., a wire spool, not shown) on wire bonding machine 100. At FIG. 1B, first bond 112a (e.g., ball bond 112a) is formed on first bonding location 114 using free air ball 108. In the illustrated example, first bond 112a is formed with wire clamps 104 in an open position. At FIG. 1C, bonding tool 102 is raised (with wire clamps 104 in an open position) above first bonding location 114 as indicated by the upward arrow. Between the positions shown in FIG. 1C and FIG. 1D, various wire looping motions may be performed as desired in the given application. In any event, at FIG. 1D, bonding tool 102 is raised to position 118 (e.g., a top of loop (TOL) position). At FIG. 1E wire clamps 104 are closed, and a continuity test may be performed to confirm that first bond 112a is bonded to first bonding location 114. After the test at FIG. 1E, bonding tool 102 is moved toward second bonding location 120 (e.g., a lead 120 of a leadframe) as indicated by the downward arrow in FIG. 1F. At approximately the position shown in FIG. 1F, wire clamps 104 may be opened such that during the second bond formation shown in FIG. 1G wire clamps 104 may be open. In FIG. 1H, with wire clamps 104 still open, bonding tool 102 is raised to height 124 (e.g., a tail height for forming a wire tail to be used to form a free air ball for a later wire loop). Wire clamps 104 are then closed to be in contact with wire 106 as illustrated in FIG. 1I, and a continuity test may be performed to confirm that the second bond formed at FIG. 1G is bonded to second bonding location 120. At FIG. 1J, bonding tool 102 has been raised (as indicated by the upward arrow), with wire clamps 104 still closed, to tear the wire from second bond 112b (e.g., a stitch bond), thereby separating the now formed wire loop 112 from wire tail 128 extending below tip 102a of bonding tool 102.

During formation of wire bonds (e.g., a first bond of a wire loop, a second bond of a wire loop, a conductive bump formed from wire, etc.), a non-stick (i.e., no-bond) condition may occur. For example, such non-stick conditions include: (a) a free air ball that does not sufficiently bond to a bond pad (i.e., non-stick-on-pad (NSOP)); and (b) the wire fails to sufficiently bond to a lead (i.e., non-stick-on-lead (NSOL)). Any of these conditions during formation of a wire loop (or a conductive bump) may result in a delay of subsequent operations and costly operator intervention. Such conditions may be caused, for example, by: contamination of a bonding location; variation of the material used to form a bonding location; etc.

Thus, it would be desirable to provide improved methods of performing wire bonding operations including improved methods of forming wire loops and conductive bumps.

SUMMARY OF THE INVENTION

According to an exemplary embodiment of the present invention, a method of performing a wire bonding operation is provided. The method includes the steps of: (a) performing a wire bonding operation between a portion of wire and a bonding location using a bonding tool; (b) raising the bonding tool to a desired height; (c) performing a test to determine if the portion of wire is sufficiently bonded to the bonding location; and (d) automatically performing another wire bonding operation between the portion of wire and the bonding location using the bonding tool if, during step (c), it is determined that the portion of wire was not sufficiently bonded to the bonding location in step (a).

According to another exemplary embodiment of the present invention, a method of forming a wire loop is provided. The method includes the steps of: (a) performing a bonding operation between a free air ball formed from a wire and a first bonding location using a bonding tool; (b) raising the bonding tool to a desired height; (c) performing a test to determine if the free air ball is sufficiently bonded to the first bonding location; and (d) automatically performing another bonding operation between the free air ball and the first bonding location if, during step (c), it is determined that the free air ball was not sufficiently bonded to the first bonding location in step (a).

According to yet another exemplary embodiment of the present invention, a method of forming a wire loop is provided. The method includes the steps of: (a) forming a first bond of wire at a first bonding location using a bonding tool; (b) extending a length of wire, continuous with the first bond, to a second bond location; (c) performing a bonding operation between a portion of the length of wire and the second bonding location using the bonding tool; (d) raising the bonding tool to a desired height; (e) performing a test to determine if the portion of the length of wire is sufficiently bonded to the second bonding location; (f) automatically performing another bonding operation between the portion of the length of wire and the second bonding location if, during step (e), it is determined that the portion of the length of wire was not sufficiently bonded to the second bonding location.

According to another exemplary embodiment of the present invention, a method of forming a conductive bump is provided. The method includes the steps of: (a) performing a bonding operation between a free air ball formed from a wire to a bonding location using a bonding tool; (b) raising the bonding tool to a desired height; (c) performing a test to determine if the free air ball is sufficiently bonded to the bonding location; and (d) automatically performing another bonding operation between the free air ball and the bonding location if, during step (c), it is determined that the free air ball was not sufficiently bonded to the bonding location.

The methods of the present invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. For example, the relative position of the wire clamps and the bonding tool as shown herein are not shown to scale. Included in the drawings are the following figures:

FIGS. 1A-1J are a series of block diagrams illustrating a conventional process of forming a wire loop;

FIGS. 2A-2O are a series of block diagrams illustrating a method of forming a wire loop in accordance with an exemplary embodiment of the present invention;

FIGS. 4A-4L are a series of block diagrams illustrating a method of forming a conductive bump in accordance with an exemplary embodiment of the present invention.

DETAILED DESCRIPTION OF THE INVENTION

Figure 3M:
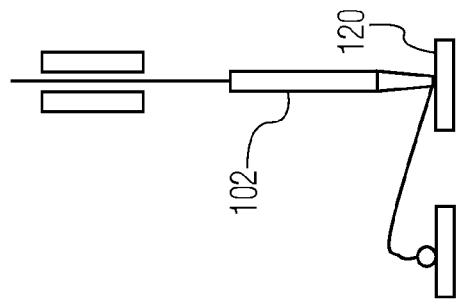
FIGS. 3A-3P are a series of block diagrams illustrating another method of forming a wire loop in accordance with another exemplary embodiment of the present invention.

In connection with various aspects of the present invention, attempted wire bonds (e.g., first bonds of wire loops, second bonds of wire loops, other bonded portions of wire loops, conductive bumps, etc.) are tested/checked to determine if the bond is "sufficiently bonded". As used herein, the term "sufficiently bonded" is intended to refer to a condition where a wire portion is determined to be bonded according to predetermined criteria as determined in the specific application. In the examples illustrated herein, attempted bonds that have not been sufficiently bonded are shown as portions of wire not being in contact with the intended bonding location (e.g., the NSOP shown in FIG. 2C, the NSOL shown in FIG. 3I, and the NSOP shown in FIG. 4C). It is understood that a bonded portion of wire may be in contact with the desired bonding location, but the bond may still be insufficient (e.g., a weakly formed bond).

In order to determine if a portion of wire has been sufficiently bonded to the intended bonding location various tests may be performed. An exemplary test described herein in connection with the various exemplary embodiments shown in FIGS. 2A-2O, 3A-3P, and 4A-4L is an electrical continuity test. That is, an electrical continuity test may be performed to determine if the portion of wire has been adequately bonded to the intended bonding location. In order to conduct such an electrical continuity test, a conductive path is checked. For example, a detection system (such as the BITS system referenced below) may be used where the conductive path includes: the wire clamps (in a closed position); a length of wire extending from the wire clamps toward the portion of wire that has been bonded (or attempted to be bonded); the portion of wire that has been bonded (or attempted to be bonded); and the intended bonding location. If such a detection system is used, and continuity is established along the conductive path, it is generally assumed that a bond has been formed. Of course, different test systems may utilize different parameters to determine if the portion of wire is sufficiently bonded to the intended bonding location.

In accordance with various exemplary embodiments of the present invention, automatic rework processes (e.g., in-situ on the wire bonder) are provided for bump and wire bonding. For example, the processes may use existing systems for detecting bond defects such as NSOP and NSOL conditions. Exemplary defect detection systems use electrical continuity detection (e.g., a bond integrity test system, such as a "BITS" system provided on machines sold by Kulicke and Soffa Industries, Inc. of Fort Washington, Pa.) to determine if a portion of wire is sufficiently bonded to a bonding location. If a portion of wire (e.g., a ball bond, a stitch bond, etc.) is not sufficiently bonded to a bonding location, an automatic re-bonding process (included in a wire bonding program run by a computer included in, or connected to, a wire bonding machine) may be used to re-bond the insufficiently bonded portion to the bonding location. The re-bond process may be performed at the same area of the bonding location; alternatively, an area offset from the original area of the bonding location may be used. For example, the re-bond process may include a parameter for performing the re-bond operation at an offset area that is a predetermined XY offset from the original area. The re-bond process may be performed using the same bonding parameters (e.g., bond force, ultrasonic energy level/profile, bond time, XY table scrub, etc.) as the original bond process although one or more of the bonding parameters may be changed.

By automatically recovering from a non-stick error (e.g., NSOP, NSOL, etc.), the need for an operator to perform a manual rework (or otherwise intervene in the bonding process) may be substantially reduced. In connection with the rework, the event (e.g., a detected non-stick condition and/or the subsequent re-bond process) may be logged or otherwise stored in memory of a computer (e.g., the wire bonder computer). As will be explained below, the present invention may be particularly beneficial when a non-stick condition is detected before the wire would otherwise be torn (e.g., before the wire is torn after second bond formation).

Referring now specifically to FIGS. 2A-2O (which relates to the detection of an NSOP condition), FIG. 2A illustrates parts of a wire bonding machine 100 including bonding tool 102 (e.g., capillary 102), wire clamps 104 (in an open position in FIG. 1A), wire 106, and free air ball 108 having been formed and seated at tip 102a of bonding tool 102. In FIG. 2A, bonding tool 102 is shown moving towards first bonding location 114 (e.g., bond pad 114 of a semiconductor die) as indicated by the downward arrow. Wire 106 continuous with free air ball 108 extends through bonding tool 102 and back to a wire supply (e.g., a wire spool, not shown) on wire bonding machine 100. At FIG. 2B, a wire bonding operation/process is performed (e.g., with wire clamps 104 in an open position) in an attempt to form a first bond (e.g., a ball bond) on first bonding location 114 using free air ball 108. Because FIGS. 2A-2O relate to automatic recovery from an NSOP condition, free air ball 108 is not properly bonded to bonding location 114. The insufficiently bonded free air ball is labelled using reference numeral 212a' in FIG. 2B. At FIG. 2C, bonding tool 102 (and wire clamps 104, both carried by a bond head assembly, not shown) is raised above first bonding location 114 (as indicated by the upward arrow) to check height 216 shown in FIG. 2D. At check height 216, wire clamps 104 are closed to be in contact with a portion of wire 106 as shown in FIG. 2D. At check height 216 a test is performed to determine if the ball bond is sufficiently bonded to bonding location 114. If the ball bond was sufficiently bonded to bonding location 114 (e.g., as determined by an electrical continuity test, where wire clamps 104 are a portion of a conductive path used to perform the electrical continuity test) the process would continue to a wire looping process, where bonding tool 102 would eventually be raised to a top of loop (i.e., "TOL") position (e.g., see FIG. 2I). However, because of the NSOP condition that is detected (i.e., because insufficiently bonded free air ball 212a' is not bonded to bond location 114), the inventive automatic re-bonding process is initiated. Through this process, insufficiently bonded free air ball 212a' will be re-bonded to bonding location 114 during another wire bonding operation that is automatically performed (e.g., as instructed through computer program instructions included in a wire bond program). More specifically, at FIG. 2E, bonding tool 102 descends toward bonding location 114. At some time just prior to contact between insufficiently bonded free air ball 212a' and a contact surface of bonding location 114 (or at the time of contact, or just after contact, as desired), wire clamps 104 are opened as shown at FIG. 2F. At FIG. 2F, insufficiently bonded free air ball 212a' is re-bonded to bonding location 114 to form first bond 212a (see FIG. 2G). This re-bond process may be performed at the same area of bonding location 114, or an area offset from the original area of bonding location 114 may be used. The re-bond process may be performed using the same bonding parameters used during the original bonding process shown at FIG. 2B, or one or more of the bonding parameters may be changed (e.g., changed in a manner set forth in a wire bonding program accessible by a computer included or connected to the wire bonding machine).

At FIG. 2G, bonding tool 102 (and wire clamps 104) is raised above first bonding location 114 (as indicated by the upward arrow) and stops at check height 216 as shown in FIG. 2H. At check height 216, wire clamps 104 are closed to be in contact with a portion of wire 106 as shown in FIG. 2H. At check height 216 a test is performed to determine if the insufficiently bonded free air ball (212a') is sufficiently bonded to bonding location 114. Since the ball bond is sufficiently bonded to bonding location 114 in FIG. 2H (e.g., as determined by an electrical continuity test, where wire clamps 104 are included in the conductive path of an electrical circuit) the process continues to a wire looping process, where bonding tool 102 is eventually raised to a top of loop (i.e., "TOL") position (e.g., see FIG. 2I). If the insufficiently bonded free air ball (212a') was not now sufficiently bonded to bonding location 114 as determined by the test at FIG. 2H (e.g., similar to the situation shown in FIG. 2D), then the re-bond process may be repeated (with the same or different bonding parameters, at the same or different area of bonding location 114) and/or an operator may be notified (e.g., where the automatic wire bonding machine operation may be interrupted).

Figure 3L:
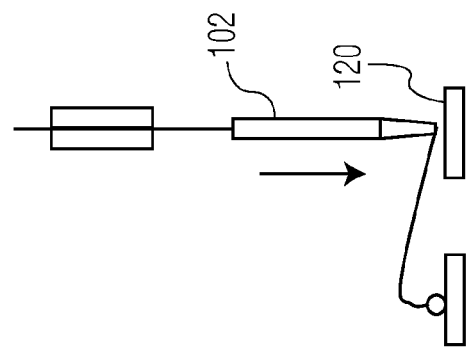
Figure 3K:
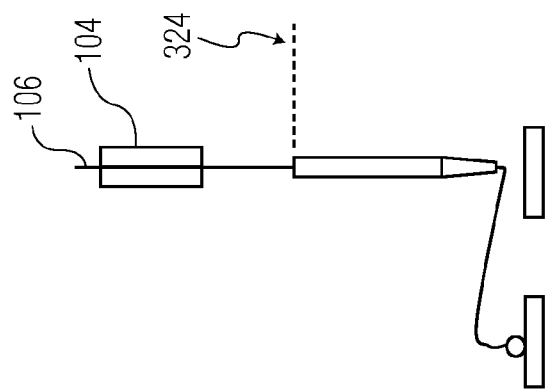
Figure 3J:
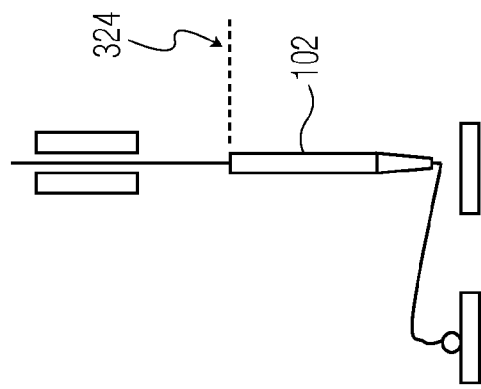
Figure 3P:
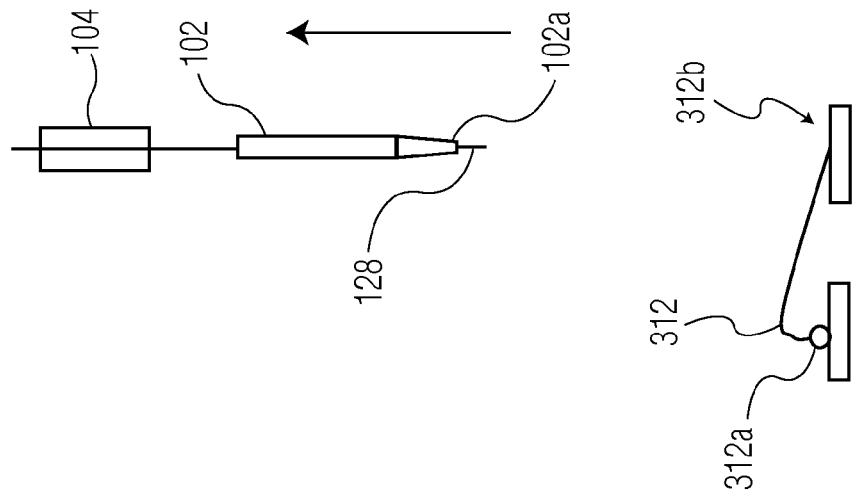

Because it was determined that the ball bond was sufficiently bonded to bonding location 114 in FIG. 2H, the wire looping process continues with bonding tool 102 raised to TOL position 218 shown in FIG. 2I. Then wire clamps 104 are closed at TOL position 218 as shown in FIG. 2J, and a continuity test may be optionally performed to confirm that first bond 212a is bonded to first bonding location 114. After the test at FIG. 2J, bonding tool 102 is moved toward second bonding location 120 (e.g., a lead 120 of a leadframe) as indicated by the downward arrow in FIG. 2K. At approximately the position shown in FIG. 2K, wire clamps 104 may be opened such that during the second bond formation shown in FIG. 2L wire clamps 104 are open. In FIG. 2M, with wire clamps 104 still open, bonding tool 102 is raised to height 224 (e.g., a tail height for forming a wire tail to be used to form a free air ball for a later wire loop). Wire clamps 104 are then closed to be in contact with wire 106 as illustrated in FIG. 2N, and a continuity test may be performed to confirm that the second bond formed at FIG. 2N is sufficiently bonded to second bonding location 120. At FIG. 2O, bonding tool 102 has been raised (as indicated by the upward arrow), with wire clamps 104 still closed, to tear the wire from second bond 212b (e.g., a stitch bond), thereby separating the now formed wire loop 212 from wire tail 128 extending below tip 102a of bonding tool 102. Wire loop 212 includes first bond 212a, second bond 212b, and a length of wire therebetween FIGS. 3A-3P illustrate the detection of an NSOL condition and its remedy. FIG. 3A illustrates parts of wire bonding machine 100 including bonding tool 102 (e.g., bonding tool 102), wire clamps 104 (in an open position), wire 106, and free air ball 108 having been formed and seated at tip 102a of bonding tool 102, with bonding tool 102 moving towards first bonding location 114 as indicated by the downward arrow. Wire 106 is continuous with free air ball 108 and extends through bonding tool 102 and back to a wire supply (e.g., a wire spool, not shown) on the wire bonding machine. At FIG. 3B, first bond 312a (e.g., ball bond 312a) is formed on first bonding location 114 (e.g., bond pad 114 of a semiconductor die) with wire clamps 104 in an open position. At FIG. 3C, bonding tool 102 and wire clamps 104 (still in an open position) are raised above first bonding location 114 as indicated by the upward arrow (e.g., carried by a bond head assembly, not shown). In accordance with the present invention, bonding tool 102 and wire clamps 104 are raised to check height 316 as illustrated in FIG. 3D. At check height 316, wire clamps 104 are closed about a portion of wire 106 to complete an electrical circuit and a test is performed to determine if attempted ball bond 312a is sufficiently bonded to first bonding location 114. As illustrated, free air ball 108 has been sufficiently bonded to first bonding location 114, to form a bonded free air ball 312a (i.e., ball bond 312a). After certain wire looping motions, bonding tool 102 (with wire clamps 104 in an open position) is raised to TOL position 318 as illustrated in FIG. 3E. As illustrated in FIG. 3F, wire clamps 104 are closed, and then at FIG. 3G bonding tool 102 moves toward second bond location 120 (e.g., lead 120 of a leadframe) as indicated by the downward arrow. Just before contact between a portion of wire 106 and second bond location 120, wire clamps 104 are opened and the portion of wire 106 is attempted to be bonded to second bond location 120 as illustrated in FIG. 3H in connection with a bonding operation. As illustrated in FIG. 3I, bonding tool 102 is then raised above second bond location 120 (as indicated by the arrow), with wire clamps 104 in an open position. As illustrated, the portion of wire 106 was not sufficiently bonded to lead 120. As illustrated in FIG. 3J, bonding tool 102 is raised to tail height 124. Of course, if desired, a height different from tail height 124 may be utilized. After reaching tail height 124, wire clamps 104 are closed about a portion of wire 106 as shown in FIG. 3K. A test (e.g., an electrical continuity test, where wire clamps 104 are part of a conductive path of an electrical circuit used to perform the test) is performed to determine whether the portion of wire 106 was sufficiently bonded to second bond location 120. As illustrated, a sufficient bond has not been formed (i.e., there is an NSOL condition) as detected by the continuity test. Accordingly, an attempt will be made to re-bond a portion of the wire 106 to second bonding location 120 via another bonding operation. As illustrated in FIG. 3L, bonding tool 102, with wire clamps 104 in a closed position, is lowered toward second bond location 120 as indicated by the downward arrow. Wire clamps 104 are opened just before contact with second bond location 120. FIG. 3M illustrates another bonding operation attempting to re-bond a portion of wire 106 to second bonding location 120. This re-bond process may be performed at the same area of second bonding location 120, or an area offset from the original area of second bonding location 120 may be used. The re-bond process may be performed using the same bonding parameters used during the original bonding process shown at FIG. 3H, or one or more of the bonding parameters may be changed (e.g., changed in a manner set forth in a wire bonding program accessible by a computer included or connected to the wire bonding machine).

Figure 3O:
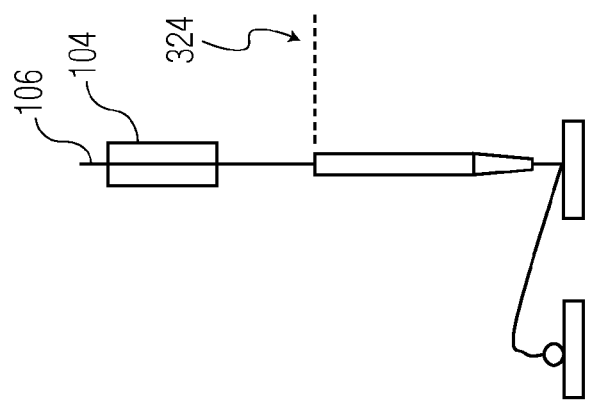
Figure 3N:
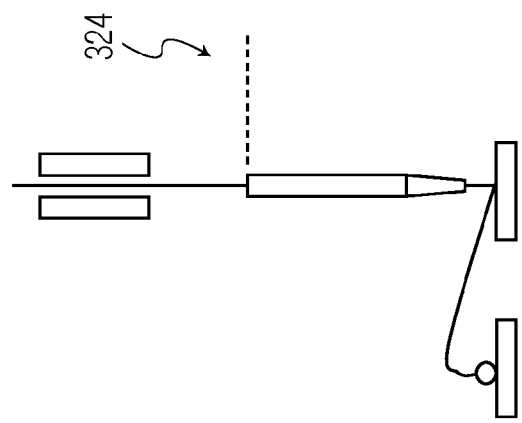

As illustrated in FIG. 3N, bonding tool 102 has been raised towards tail height 324 (with wire clamps 104 in an open position). Upon reaching tail height 324 wire clamps 104 are closed as shown at FIG. 3O, and a test (e.g., the previously described electrical continuity test) is performed to determine if the re-bond/bond process has provided a sufficient connection between the portion of wire 106 and second bonding location 120. If the re-bond process is not successful, then a subsequent re-bond may be attempted, or the wire bonding program may be interrupted for operator assistance. However, as illustrated in FIG. 3O, the re-bond was successful and a desirable second bond has been formed. At FIG. 3P, bonding tool 102 is further raised as indicated by the upward arrow (as carried by the bond head assembly, with wire clamps 104 in a closed position) to tear the wire from stitch bond 312b, thereby separating the now formed wire loop 312 from wire tail 128 extending below tip 102a of bonding tool 102. Wire loop 312 includes first bond 312a, second bond 312b, and a length of wire therebetween.

Figure 4L:
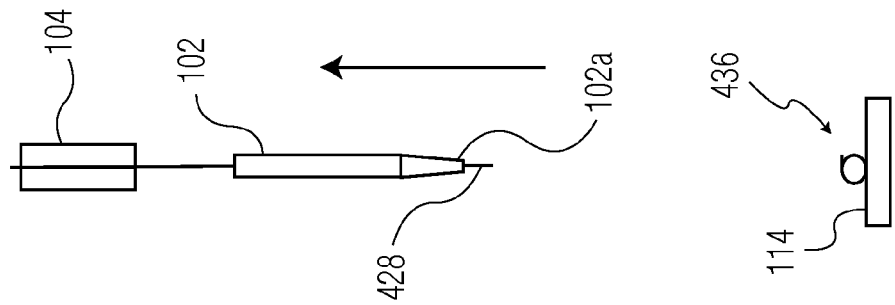
Figure 4K:
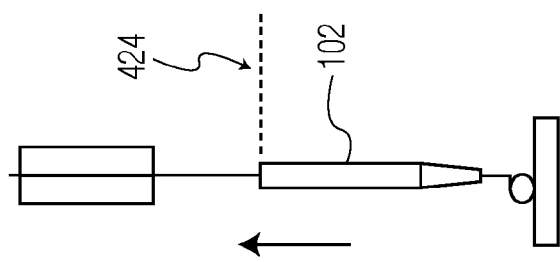

FIGS. 4A-4L relate to the detection of an NSOP condition during formation of a conductive bump in accordance with an exemplary embodiment of the present invention. FIG. 4A illustrates parts of a wire bonding machine 100 including bonding tool 102 (e.g., capillary 102), wire clamps 104 (in an open position), wire 106, and free air ball 108 having been formed and seated at tip 102a of bonding tool 102, with bonding tool 102 moving towards bonding location 114 (e.g., a die pad 114 of a semiconductor die) as indicated by the arrow. Wire 106 is continuous with free air ball 108 and extends through bonding tool 102 and back to a wire supply (e.g., a wire spool, not shown) on the wire bonding machine. At FIG. 4B, a bonding operation is performed (e.g., with wire clamps 104 opened) in an attempt to form a bond between free air ball 108 and bonding location 114. At FIG. 4C, bonding tool 102 and wire clamps 104 (still in an open position) are raised above first bonding location 114 as indicated by the arrow. However, as illustrated in FIGS. 4B-4C, attempted ball bond 412a' did not sufficiently bond/stick to bonding location 114 as determined by, for example, an electrical continuity test (e.g., where wire clamps 104 are included in the conductive path used in the electrical continuity test). In accordance with the present invention, bonding tool 102 and wire clamps 104 are raised to tail height 424 (or another height, as desired) as illustrated in FIG. 4D. At tail height 424, wire clamps 104 are closed about a portion of wire 106 to complete an electrical circuit and a test is performed to determine if attempted ball bond 412a' is sufficiently bonded to bonding location 114. However, and as illustrated in FIG. 4D, at tail height 424 a sufficient connection is not detected between attempted bonded free air ball 412a' and bonding location 114 (an NSOP condition exists). That is, for example, in an electrical continuity test, a completed electrical circuit (wherein a portion of the conductive path of the circuit is between closed wire clamps 104 and bonding location 114) is not detected. Accordingly, attempted ball bond 412a' will be re-bonded to first bonding location 114 through another bonding operation. As illustrated in FIG. 4E, bonding tool 102, with wire clamps 104 open, is lowered towards bonding location 114 as indicated by the arrow, and FIG. 4F illustrates attempted ball bond 412a' being re-bonded to bonding location 114 to form ball bond 412a (sufficiently bonded free air ball 412a). This re-bond process may be performed at the same area of bonding location 114 (i.e., the same as in FIG. 4B), or an area offset from the original area of bonding location 114 may be used. The re-bond process may be performed using the same bonding parameters used during the original bonding process shown at FIG. 4B, or one or more of the bonding parameters may be changed (e.g., changed in a manner set forth in a wire bonding program accessible by a computer included or connected to the wire bonding machine).

As illustrated in FIG. 4G, bonding tool 102 is again raised towards tail height 424 (with open clamps 104), as indicated by the arrow, to determine if the re-bond process has provided a sufficient connection between attempted ball bond 412a' and bonding location 114 (i.e., if ball bond 412a is sufficiently bonded). FIG. 4H illustrates bonding tool 102 at tail height 424 with clamps 104 in a closed position about a portion of wire 106. Another test may be performed to determine whether there is a sufficient bond/connection between ball bond 412a and bonding location 114. As illustrated in FIG. 4H, such a test would be successful, as bonded free air ball 412a is sufficiently bonded to bonding location 114. If the test was not successful (i.e., if bonded free air ball 412a was not sufficiently bonded to bonding location 114), then the re-bond process may be repeated (with the same or different bonding parameters, at the same or different area of bonding location 114) and/or an operator may be notified (e.g., where the automatic wire bonding machine operation may be interrupted).

Figure 4J:
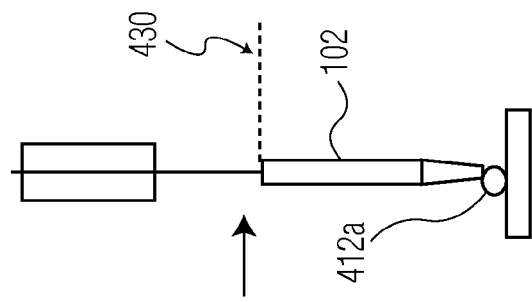

Since the test was successful, the process then continues to FIG. 4I where bonding tool 102 has been lowered to smoothing height 430, and an optional bump smoothing process is performed at FIG. 4J (e.g., as indicated by the arrow directed to the right). At FIG. 4K, bonding tool 102 has been raised (carried by the bond head assembly) to tail height 424. At FIG. 4L, with wire clamps 104 still closed, bonding tool 102 is further raised (as indicated by the upward arrow) to tear the wire proximate conductive bump 436, thereby separating now formed conductive bump 436 (i.e., bonded free air ball 108) from wire tail 428 extending below tip 102a of bonding tool 102. Of course, if no bump smoothing was performed, steps shown at FIGS. 4I, 4J, and 4K may be omitted.

As will be appreciated by those skilled in the art, in certain applications it may be desirable to make an adjustment to account for the length of wire that has been payed out in connection with re-bonding processes.

Although the present invention has been described primarily with respect to simple wire loops and conductive bumps, it is not limited thereto. For example, the methods disclosed herein also have applicability to reverse bonding operations (e.g., stand-off stitch bump operations, SSB operations) and more complex wire loops (e.g., wire loops including more than two bonded portions, multi-tiered bonding, cascade bonding, stacked-die bonding, etc.).

Although the present invention has been described primarily with respect to ball bonding, it is not limited thereto. The present invention has applicability to other forms of wire bonding such as wedge bonding.

Although the present invention has been illustrated as independent methods for NSOP detection and rework (e.g., FIG. 1) and NSOL detection and rework (e.g., FIG. 2), it is understood that both techniques may be combined in a single wire bonding operation where each of the first bond and second bond are checked, and re-bonded, as needed.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of performing a wire bonding operation, the method comprising the steps of:
    (a) performing a wire bonding operation between a portion of wire and a bonding location using a bonding tool;
    (b) raising the bonding tool to a desired height with the portion of wire being in contact with the bonding location;
    (c) determining that the portion of wire in contact with the bonding location is not sufficiently bonded to the bonding location; and
    (d) automatically performing another wire bonding operation between the portion of wire and the bonding location using the bonding tool after step (c).

2. The method of claim 1 wherein the portion of wire is included in a first bond of a wire loop.

3. The method of claim 1 wherein the portion of wire is included in a second bond of a wire loop.

4. The method of claim 1 wherein the portion of wire is a free air ball configured to be formed into a conductive bump.

5. The method of claim 1 wherein step (c) includes performing an electrical continuity test between the portion of wire and the bonding location.

6. The method of claim 5 wherein wire clamps of a wire bonding machine are closed during the electrical continuity test, the wire clamps being a portion of a conductive path used to perform the electrical continuity test.

7. The method of claim 1 wherein step (d) is performed automatically using computer program instructions accessible from a wire bonding machine.

8. The method of claim 1 wherein step (d) is performed automatically using computer program instructions installed on a computer of a wire bonding machine.

9. The method of claim 1 where step (d) is performed without operator intervention.

10. The method of claim 1 wherein the wire bonding operation is configured to be performed on a wire bonding machine, and the wire bonding machine is configured to execute a wire bonding program controlled by a computer, and steps (a)-(d) are included in the wire bonding program such that the re-bonding in step (d) is performed without interrupting the wire bonding program.

11. The method of claim 1 wherein step (d) is performed using identical bonding parameters used during the bonding operation of step (a).

12. The method of claim 1 wherein step (d) is performed using at least one different bonding parameter from bonding parameters used during the bonding operation of step (a).

13. The method of claim 1 further comprising the step of (e) performing another test to determine if the portion of wire is sufficiently re-bonded to the bonding location after step (d).

14. The method of claim 13 further comprising the step of (f) alerting an operator if, during step (e), it is determined that the portion of wire was not sufficiently re-bonded to the bonding location.

15. The method of claim 1 wherein step (c) is performed such that the portion of wire is continuous with a wire supply of a wire bonding machine.

16. The method of claim 1 wherein the method is performed on a ball bonding machine.

17. The method of claim 1 wherein the method is performed on a wedge bonding machine.

18. A method of forming a wire loop, the method comprising the steps of:
    (a) performing a bonding operation between a free air ball formed from a wire and a first bonding location using a bonding tool;
    (b) raising the bonding tool to a desired height with the portion of wire being in contact with the bonding location;
    (c) determining that the wire with the free air ball in contact with the bonding location is not sufficiently bonded to the first bonding location; and
    (d) automatically performing another bonding operation between the free air ball and the first bonding location after step (c).

19. A method of forming a wire loop, the method comprising the steps of:
    (a) forming a first bond of wire at a first bonding location using a bonding tool;
    (b) extending a length of wire, continuous with the first bond, to a second bond location;
    (c) performing a bonding operation between a portion of the length of wire and the second bonding location using the bonding tool;
    (d) raising the bonding tool to a desired height with the portion of wire being in contact with the bonding location;
    (e) determining that the portion of the length of wire in contact with the bonding location is not sufficiently bonded to the second bonding location; and
    (f) automatically performing another bonding operation between the portion of the length of wire and the second bonding location after step (c).

20. A method of forming a conductive bump, the method comprising the steps of:
- (a) performing a bonding operation between a free air ball formed from a wire to a bonding location using a bonding tool;
- (b) raising the bonding tool to a desired height with the portion of wire being in contact with the bonding location;
- (c) determining that the wire with the free air ball in contact with the bonding location is not sufficiently bonded to the bonding location; and
- (d) automatically performing another bonding operation between the free air ball and the bonding location after step (c).

* * * * *